(12) United States Patent  
Liu et al.

(10) Patent No.: US 8,440,540 B2  
(45) Date of Patent: May 14, 2013

(54) METHOD FOR DOPING A SELECTED PORTION OF A DEVICE

(75) Inventors: Han-Chi Liu, Miaoli County (TW); Dun-Nian Yaung, Taipei (TW); Jen-Cheng Liu, Hsin-Chu (TW); Yuan-Hung Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 412 days.

(21) Appl. No.: 12/572,833

(22) Filed: Oct. 2, 2009

(65) Prior Publication Data

US 2011/0081766 A1   Apr. 7, 2011

(51) Int. Cl.  
*H01L 21/76* (2006.01)

(52) U.S. Cl.  
USPC .................................. 438/433; 257/E21.551

(58) Field of Classification Search .................. 438/433; 257/E21.551  
See application file for complete search history.

(56) References Cited

U.S. PATENT DOCUMENTS

| | | | |
|---|---|---|---|
| 5,401,998 A * | 3/1995 | Chiu et al. | 257/368 |
| 6,989,332 B1 * | 1/2006 | Bell et al. | 438/719 |
| 2001/0014511 A1 * | 8/2001 | Pan | 438/424 |
| 2002/0086495 A1 * | 7/2002 | Yoo et al. | 438/423 |
| 2007/0105337 A1 * | 5/2007 | Chen et al. | 438/424 |
| 2009/0256226 A1 * | 10/2009 | Tatani et al. | 257/432 |

\* cited by examiner

*Primary Examiner* — Daniel Luke  
(74) *Attorney, Agent, or Firm* — Haynes and Boone, LLP

(57) ABSTRACT

A method includes forming a protective layer with an opening over a substrate, thereafter implanting a dopant into a substrate region through the opening, the protective layer protecting a different substrate region, and reducing thickness of the protective layer. A different aspect includes etching a substrate to form a recess therein, thereafter implanting a dopant into a substrate region within the recess and through an opening in a protective layer provided over the substrate, and reducing thickness of the protective layer. Another aspect includes forming a protective layer over a substrate, forming photoresist having an opening over the protective layer, etching the protective layer through the opening to expose the substrate, etching the substrate to form a recess in the substrate, implanting a dopant into a substrate portion, the protective layer protecting a different substrate portion thereunder, and etching the protective layer to reduce its thickness.

20 Claims, 10 Drawing Sheets

METHOD FOR DOPING A SELECTED PORTION OF A DEVICE

TECHNICAL FIELD

The present disclosure relates generally to the field of semiconductor fabrication, and more particularly, to the fabrication of semiconductor image sensors.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, to collect photon energy to convert images into electrical signals. Adjacent pixels are separated by a recess in the substrate, where the recess is part of an isolation structure. However, leakage current may occur as a result of the formation of the recess. Leakage current may cause defects in the image sensor, such as "white pixels." To prevent leakage current, portions of the substrate beneath the recess may be implanted with a dopant. But there are competing practical considerations in fabricating the image sensor that make the dopant implantation difficult to implement. Thus, while existing methods of fabricating image sensors have been generally adequate for their intended purposes, they have not been entirely satisfactory in every aspect.

SUMMARY

One of the broader forms of the present disclosure involves a method of fabricating a semiconductor device that includes: providing a substrate; forming a protective layer over the substrate, the protective layer having an opening therethrough and a first thickness; thereafter implanting a dopant into a first region of the substrate through the opening, the protective layer protecting a second region of the substrate from the dopant, the second region being different from the first region; and reducing the thickness of the protective layer to a second thickness less than the first thickness.

Another of the broader forms of the present disclosure involves a method of fabricating a semiconductor device that includes: providing a substrate; performing an etching process that includes etching the substrate to form an upwardly-open recess therein; thereafter implanting a dopant into a region of the substrate through a surface of the substrate within the recess and through an opening in a protective layer provided over the substrate, the opening being aligned with the recess, and the protective layer having a first thickness and protecting regions of the substrate thereunder from the dopant; and reducing the thickness of the protective layer to a second thickness less than the first thickness.

Still another of the broader forms of the present disclosure involves a method of fabricating a semiconductor device that includes: providing a substrate; forming a protective layer over the substrate, the protective layer having a first thickness; forming an anti-reflective layer over the protective layer; forming a patterned photoresist layer over the anti-reflective layer, the patterned photoresist layer having an opening therethrough; etching regions of the anti-reflective layer and the protective layer through the opening to expose a surface on a first portion of the substrate; etching the first portion of the substrate to form a recess in the substrate, the recess having therein a surface on a second portion of the substrate; implanting a dopant into the second portion of the substrate, the protective layer protecting a third portion of the substrate thereunder from the dopant; etching the protective layer so that it has a second thickness less than the first thickness; filling the recess with a dielectric material; and polishing the dielectric material; wherein the dielectric material in the recess defines a shallow trench isolation structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
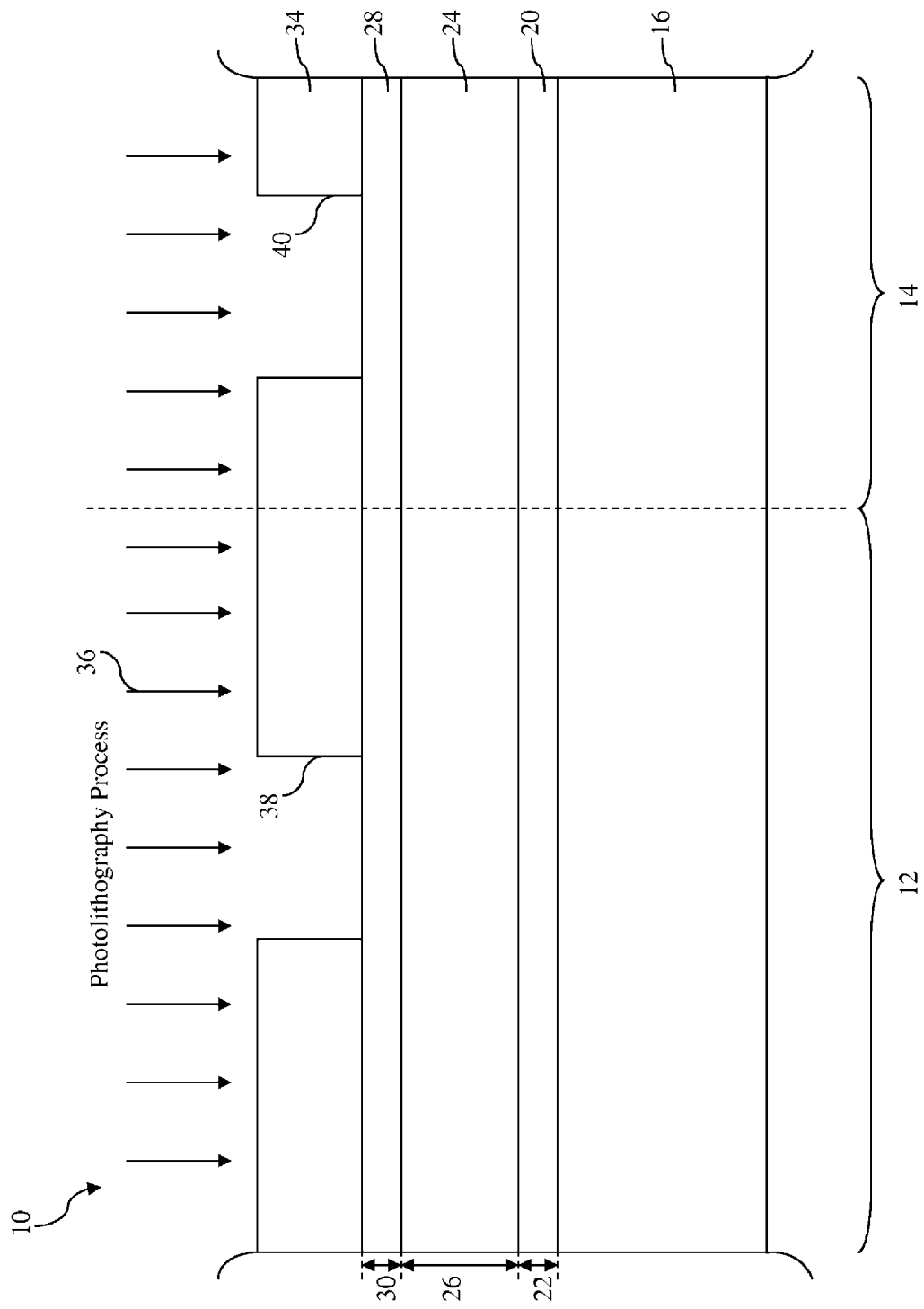
FIGS. 1 to 9 are each a diagrammatic fragmentary sectional side view of an apparatus that is a semiconductor image sensor at successive different stages during its fabrication.

FIGS. 1 to 9 are each a diagrammatic fragmentary sectional side view of an apparatus that is a semiconductor image sensor 10, and that embodies aspects of the invention. FIGS. 1 to 9 show the image sensor 10 at successive different stages during its fabrication. With reference to FIG. 1, the image sensor 10 includes a pixel-array region 12 and a periphery region 14. The dashed line in FIG. 1 designates a boundary between the pixel-array region 12 and the periphery region 14. The pixel-array region 12 will be used to form pixels that can sense radiation such as light, and the periphery region 14 will be used to form non-pixel devices of the image sensor 10, such as digital devices that control the operation of the image sensor 10.

The image sensor 10 includes a substrate 16. The substrate 16 is a silicon substrate doped with a p-type dopant such as boron (for example a p-type substrate). Alternatively, the substrate 16 could be any other suitable semiconductor material. For example, the substrate 16 may be a silicon substrate doped with an n-type dopant such as phosphorous (for example an n-type substrate). The substrate 16 could include other elementary semiconductors such as germanium and diamond. The substrate 16 could optionally include a compound semiconductor and/or an alloy semiconductor. Further, the substrate 16 could include an epitaxial layer (epi layer), may be strained for performance enhancement, and may include a silicon-on-insulator (SOI) structure.

In FIG. 1, a pad oxide layer 20 is formed on the substrate 16. The pad oxide layer 20 includes silicon oxide that is grown on the substrate 16 using a thermal oxidation furnace (not illustrated). The pad oxide layer has a thickness 22 that is in a range from about 50 Angstroms to about 110 Angstroms. Next, a protective layer 24 is formed on the pad oxide layer 20. The pad oxide layer 20 reduces a strain or stress between the protective layer 24 and the substrate 16. The protective layer 24 includes silicon nitride that is formed by a low pressure chemical vapor deposition (LPCVD) process. The protective layer 24 has a thickness 26 that is in a range from about 1500 Angstroms to about 2000 Angstroms. Thereafter, a silicon-rich oxide layer 28 is formed on the protective layer 24. The silicon-rich oxide layer 28 includes silicon oxynitride that is formed by a chemical vapor deposition (CVD) or physical vapor deposition (PVD) process or other suitable techniques known in the art. The silicon-rich oxide layer 28 has a thickness 30 that is in a range from about 100 Angstroms to about 400 Angstroms. The forming of the layers 20, 24, and 28 may be done using alternative methods known in the art but not described herein.

A photoresist layer 34 is formed on the silicon-rich oxide layer 28. The photoresist layer 34 is then patterned by a known photolithography process 36 that includes various masking, exposing, baking, and rinsing processes, in order to form openings 38 and 40 that each extend completely vertically through the photoresist layer 34 to the silicon-rich oxide layer 28. The silicon-rich oxide layer 28 serves as an anti-reflective coating (ARC) during the photolithography process 36.

Figure 2:
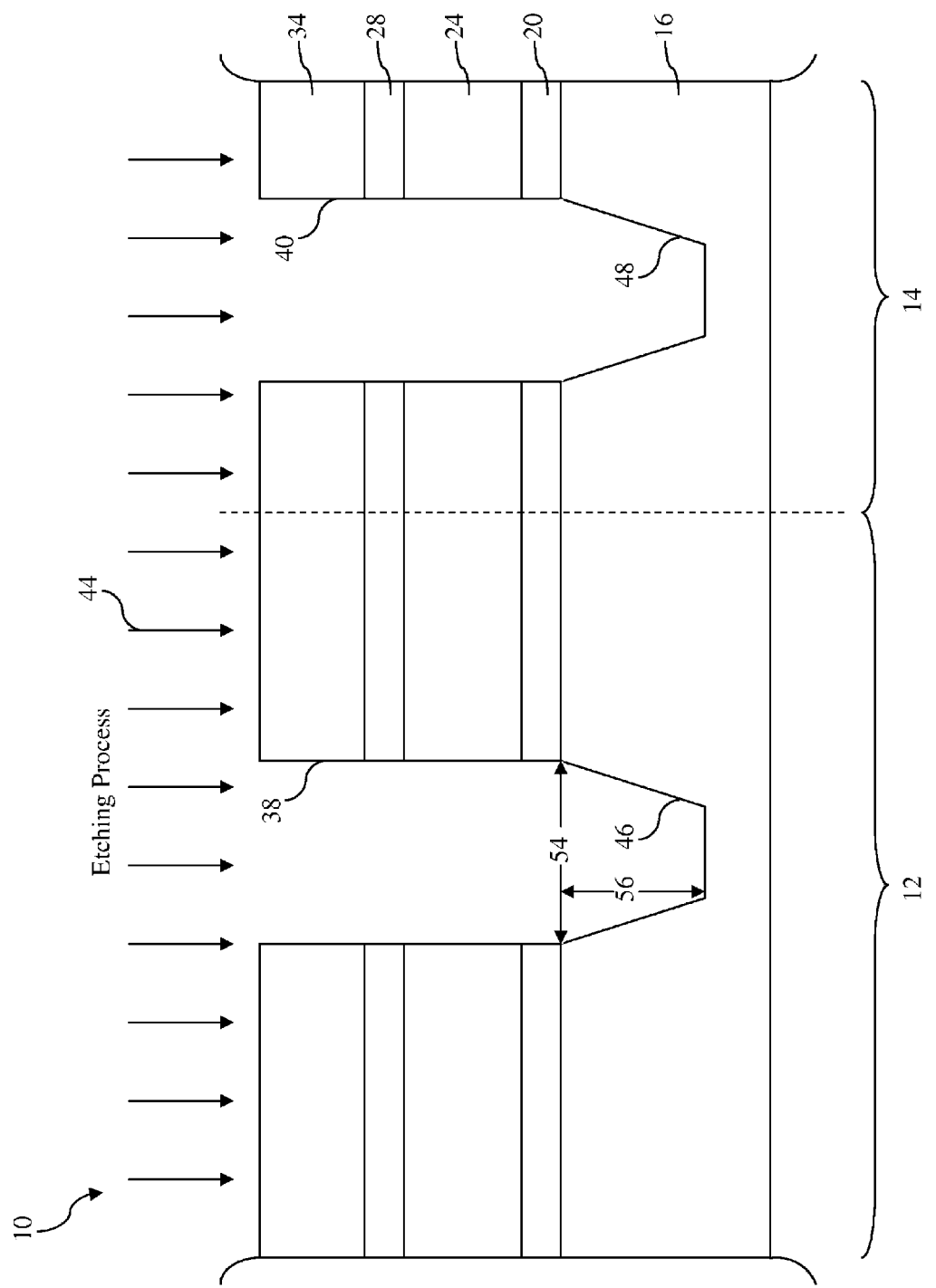

Referring now to FIG. 2, an etching process 44 is used to form a recess 46 in the pixel-array region 12 of the substrate 16 and a recess 48 in the periphery region 14 of the substrate 16. The etching process 44 utilizes etching techniques known in the art to remove portions of the silicon-rich oxide layer 28, protective layer 24, pad oxide layer 20, and substrate 16 that are below the openings 38 and 40. The etching techniques may include a dry etching process that uses a plasma gas as an etchant, such as $CHF_3$, $CF_4$, $CH_2F_2$, HBr, $Cl_2$, $SF_6$, or combinations thereof. Alternatively, the etching techniques may include a wet etching process that includes an acid as an etchant, such as HF, $NH_4F$, hot $H_3PO_4$, HF—$HNO_3$—$H_2O$, KOH, or combinations thereof. The etchants listed above are for the sake of providing an example, and it is understood that other etchants may be used to accomplish the etching process 44. The etching techniques may further include reactive ion etching (RIE) and/or sputtering. The recess 46 has a width 54 that is in a range from about 1500 Angstroms to about 2100 Angstroms. The recess 46 has a depth 56 that is in a range from about 2500 Angstroms to about 4000 Angstroms. The etching process 44 that is used to form the recess 46 may create dangling molecular chains or bonds on a surface of the substrate 16 near the recess 46. These dangling molecular chains or bonds could generate free carriers (such as electrons or holes) that could eventually result in a leakage current in the image sensor 10, known as junction leakage. Junction leakage would cause a defect known as "white pixels" in the image sensor 10. A white pixel is a pixel that shows itself as an illuminated spot on a pixel-array when it should be dark.

Figure 3:
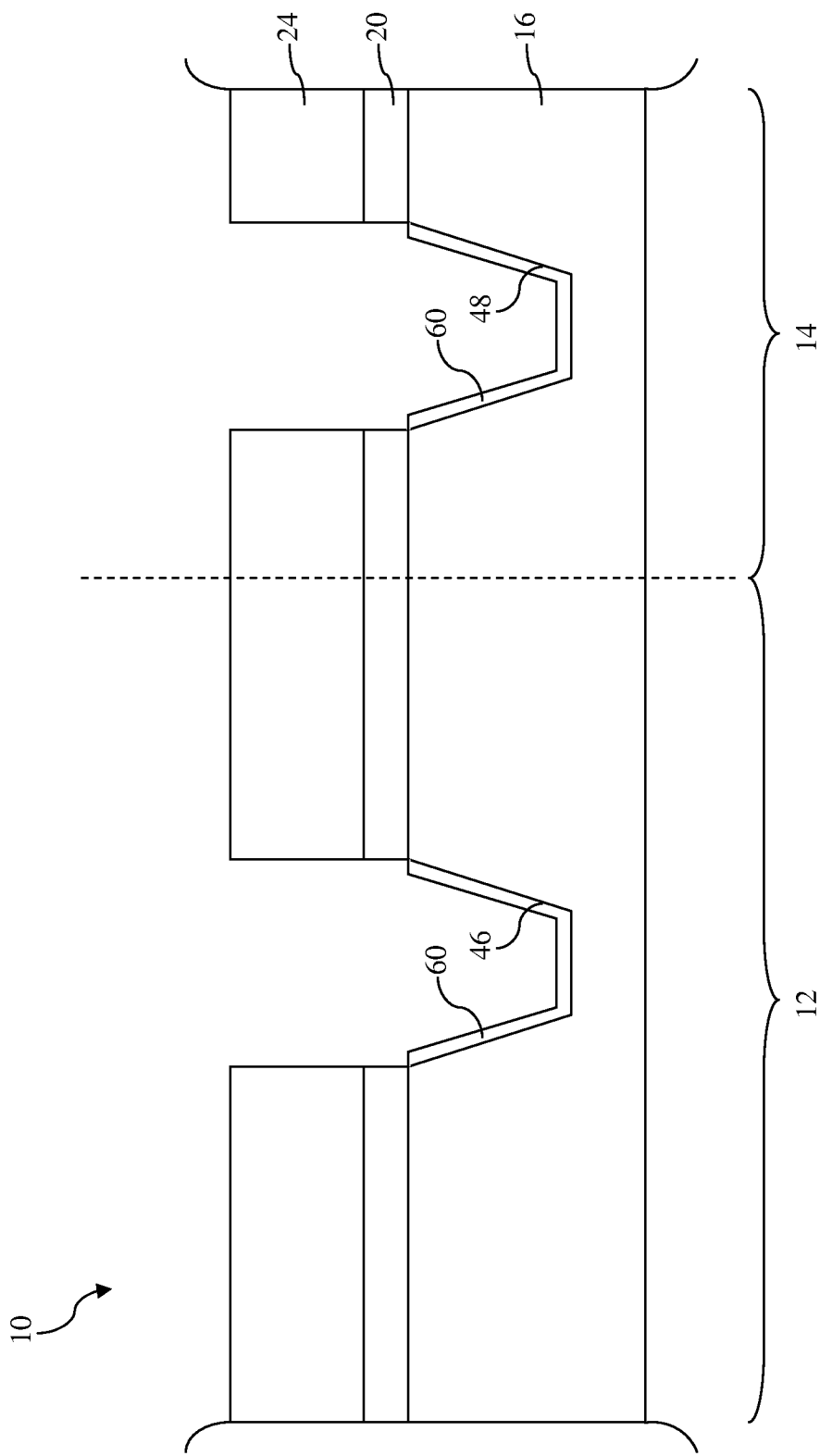

Referring now to FIG. 3, the photoresist layer 34 is removed by a stripping or ashing process known in the art. Thereafter, the silicon-rich oxide layer 28 is removed by an etching process such as a wet etching process. Since the silicon-rich oxide layer 28 includes silicon oxynitride and the protective layer 24 includes silicon nitride, there is sufficient etching selectivity between the layers 24 and 28—meaning that an etchant used in the etching process etches away the materials of the silicon-rich oxide layer 28 and the protective layer 24 at different rates. Therefore, the etching process removes substantially all of the silicon-rich oxide layer 28 while leaving the protective layer 24 mostly intact. Alternatively, a chemical-mechanical-polishing (CMP) process followed by a cleaning process may be used to remove the silicon-rich oxide layer 28. After the silicon-rich oxide layer 28 is removed, a lining oxide 60 is formed on a portion of the substrate 16 within the recesses 46 and 48. The lining oxide 60 is a thermal silicon oxide and may be grown using a heated furnace chamber (not illustrated) that is filled with an oxygen gas. Alternatively, the lining oxide 60 may be formed using a high density plasma chemical vapor deposition (HDP-CVD) process following by an annealing process. The lining oxide 60 relieves stress on the surface of the substrate 16 within the recesses 46 and 48 and reduces defects and contaminations therein.

Figure 4:
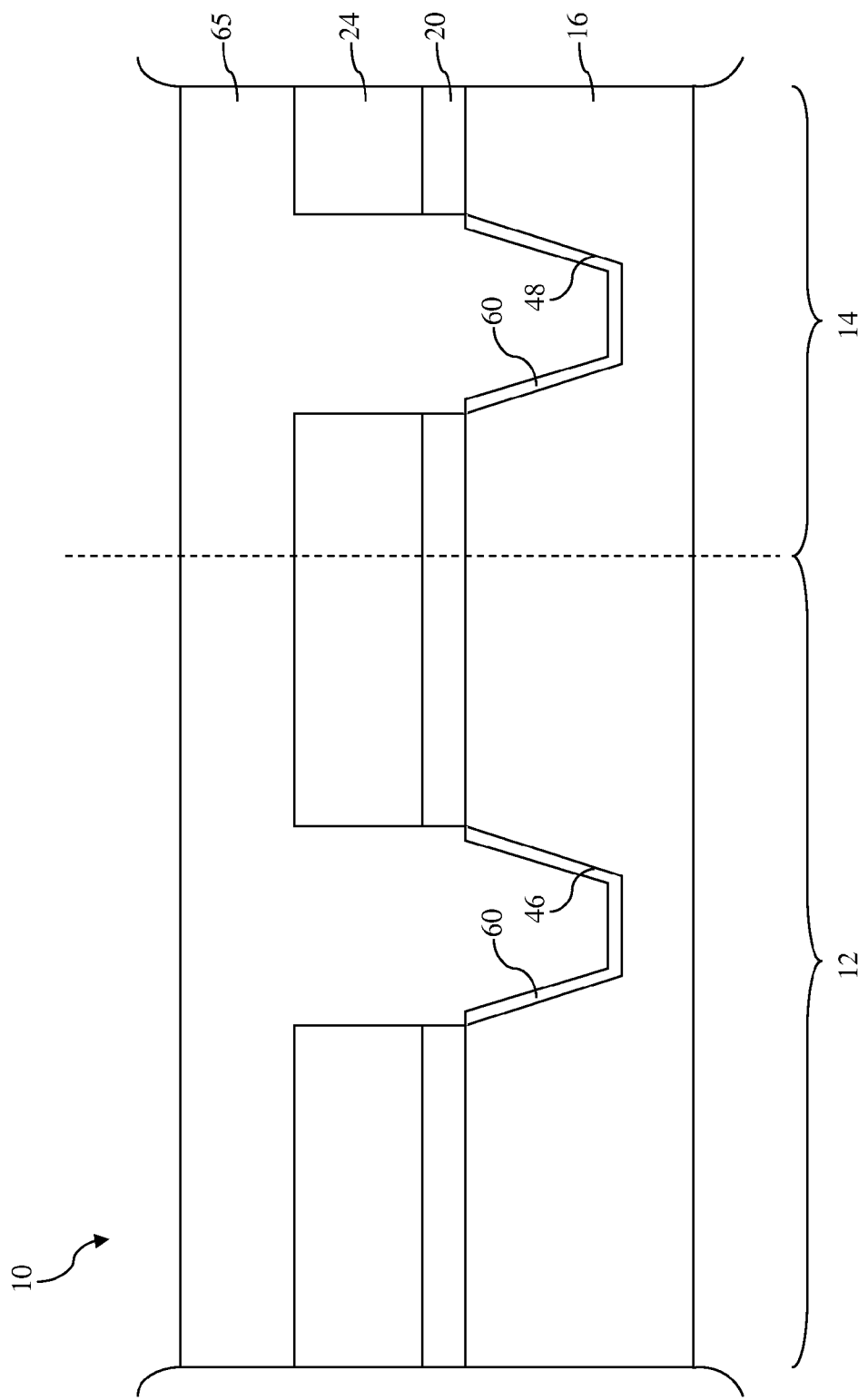
Figure 5:
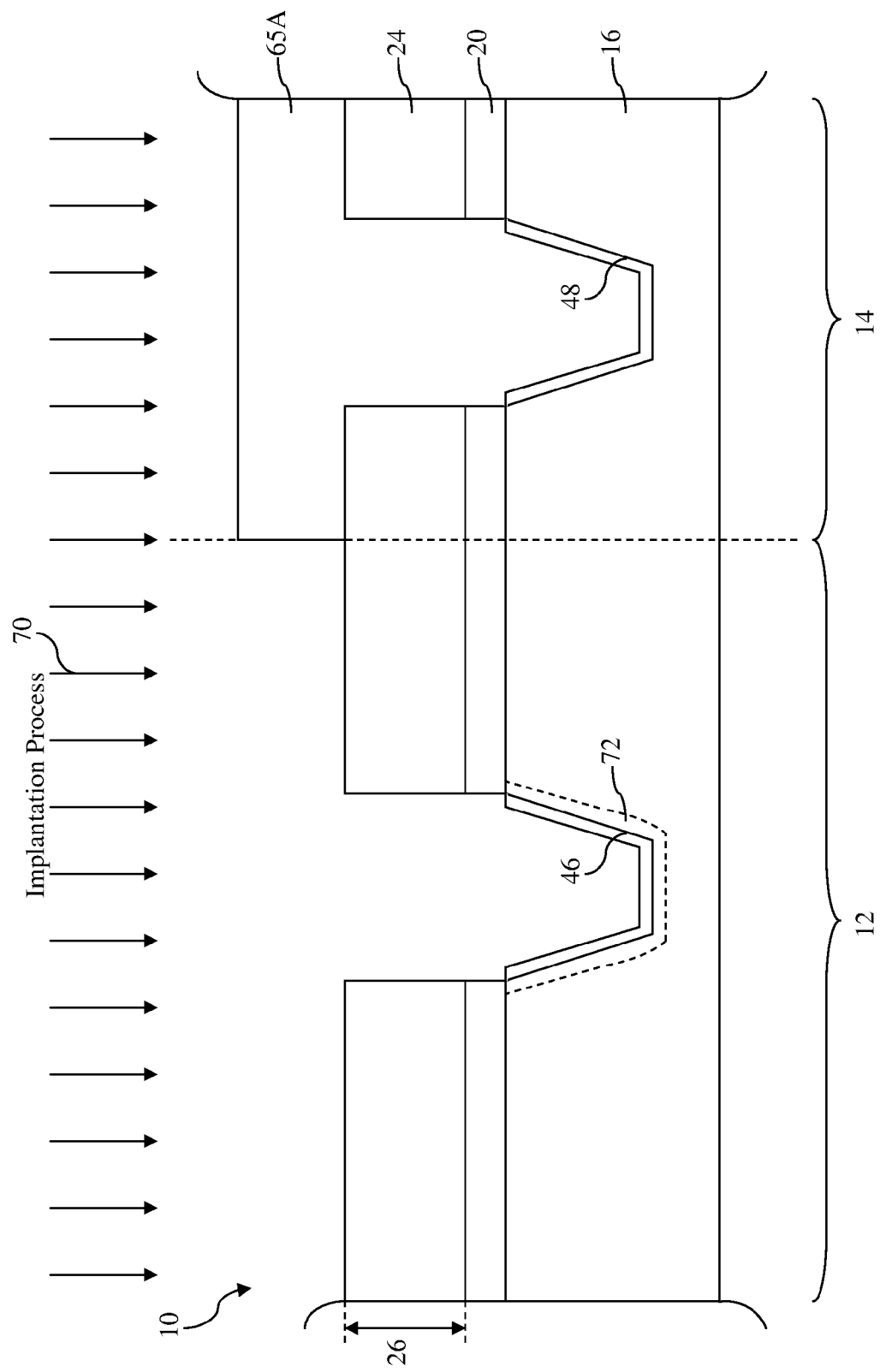

Referring now to FIG. 4, a photoresist layer 65 is formed in a known manner over the protective layer 24 and the lining oxide 60. Referring now to FIG. 5, the photoresist layer 65 is then patterned by a known photolithography process to form a photoresist mask 65A that covers the periphery region 14 of the image sensor 10. Thereafter, an implantation process 70 is performed on the image sensor 10, during which a dopant such as boron ions is implanted through the surface of the substrate 16 within the recess 46 to treat a region 72 of the substrate 16 near the recess 46. The implantation process 70 includes an implantation energy in a range from about 10 kilo-electron volts (KeV) to about 30 KeV. The implantation process 70 also includes an implantation dose in a range from about $50 \times 10^2$ ions/cm$^2$ to about $40 \times 10^3$ ions/cm$^2$. These implantation energy and dose ranges are merely exemplary, and other embodiments may utilize different implantation energy and dose ranges to carry out the implantation process 70.

The protective layer 24 protects portions of the pad oxide layer 20 and the substrate 16 therebelow from being implanted with the dopant during the implantation process 70. The implantation of the dopant into the substrate 16 reduces the number of dangling molecular chains or bonds at or near the region 72 and reduces junction leakage. Therefore, the "white pixel" defect is less severe in the image sensor 10 than would otherwise be the case. The thickness 26 of the protective layer 24 is high enough so that the dopant in the implantation process 70 does not penetrate through the protective layer 24 and into the portions of the pad oxide layer 20 and the substrate 16 therebelow. The photoresist mask 65A protects the periphery region 14 of the image sensor 10 therebelow during the implantation process 70. As such, the non-pixel devices in the periphery region 14 are not affected by the implantation process 70 and thus suffer no performance degradation.

Figure 6:
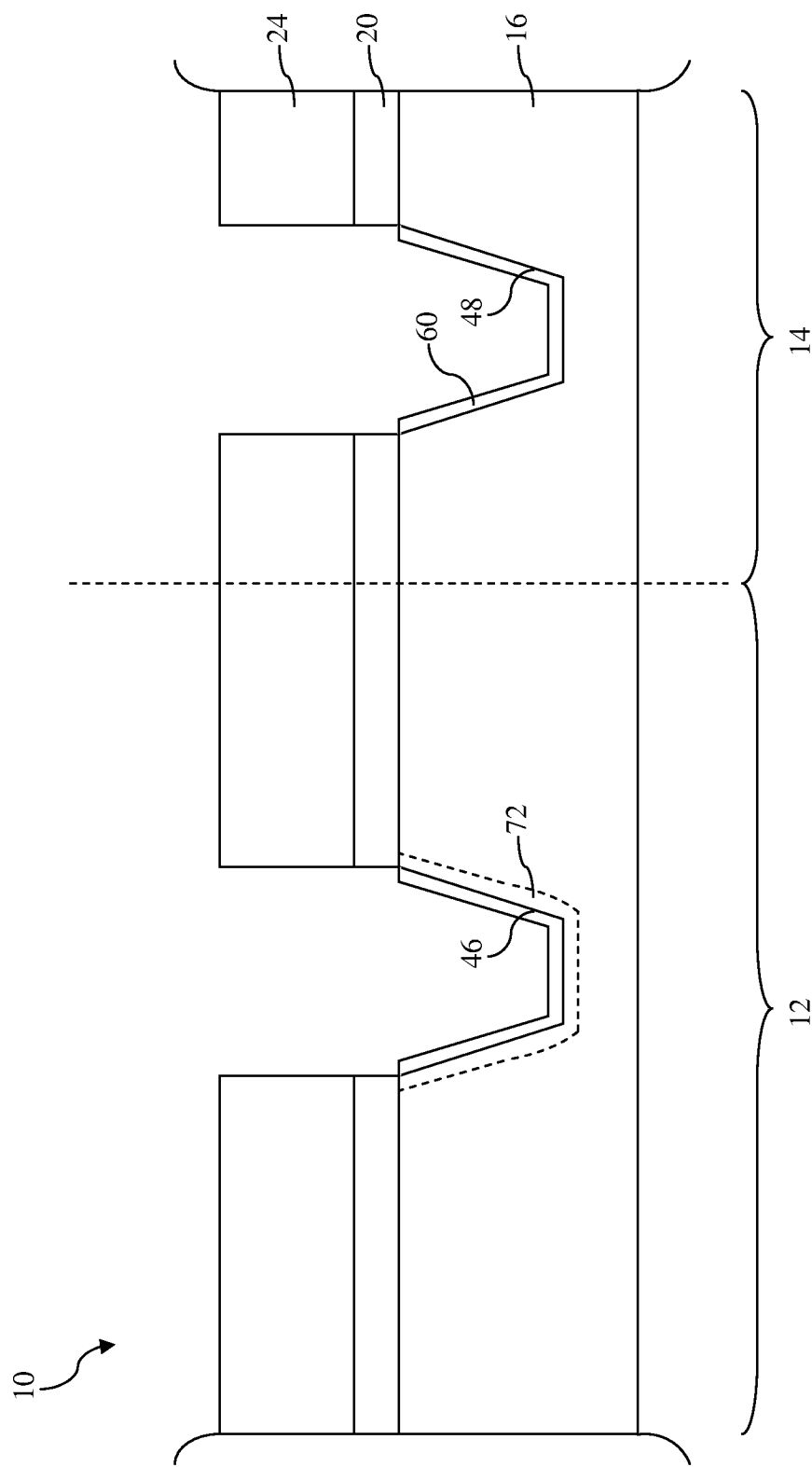
Figure 7:
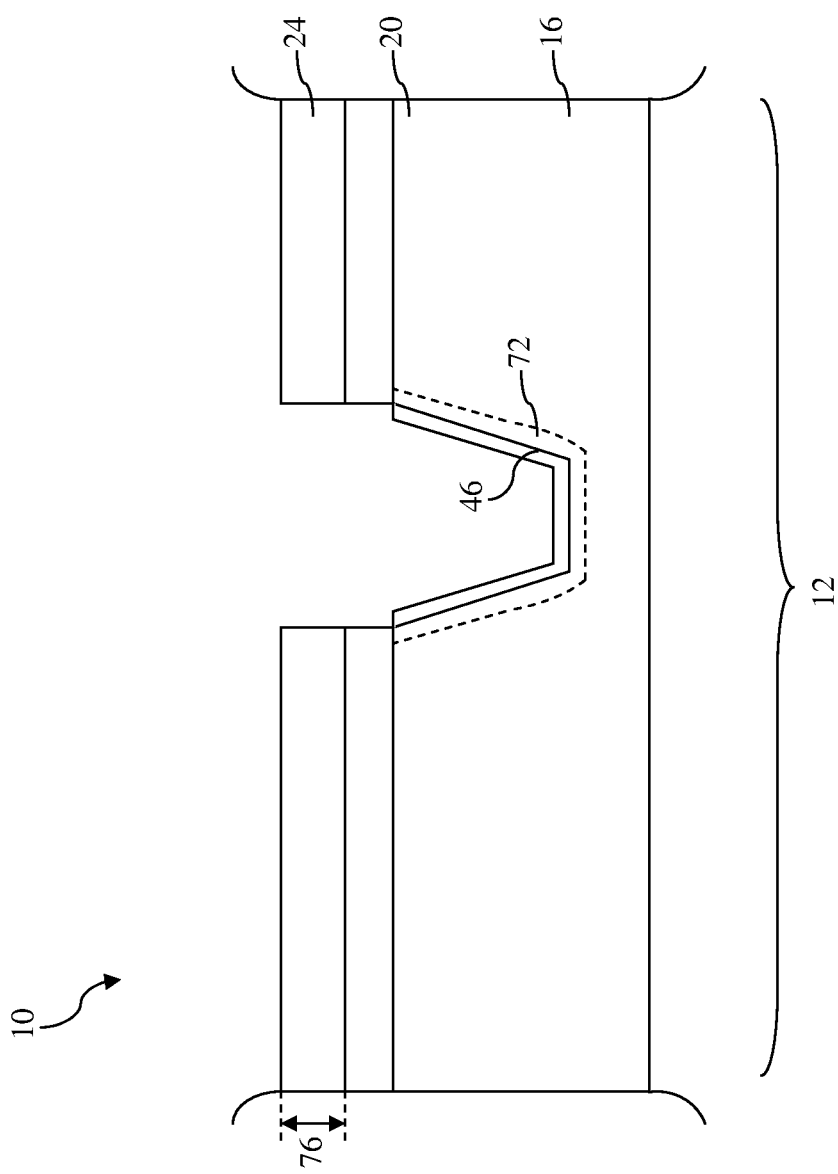

Referring to FIG. 6, the photoresist mask 65A is removed by a stripping or ashing process known in the art. Referring now to FIG. 7, only the pixel-array region 12 is shown for the sake of simplicity. Using an etching process, a portion of the protective layer 24 is etched away so that the protective layer 24 has a reduced thickness 76. The etching process may be a dry etching process that uses a hot phosphoric acid ($H_3PO_4$) as an etchant or a wet etching process that uses $CF_4$, $SF_6$, $NF_3$, or combinations thereof, as an etchant. The thickness 76 is in a range from about 500 Angstroms to about 800 Angstroms. Alternatively, the thickness of the protective layer 24 may be reduced by a CMP process.

Figure 8:
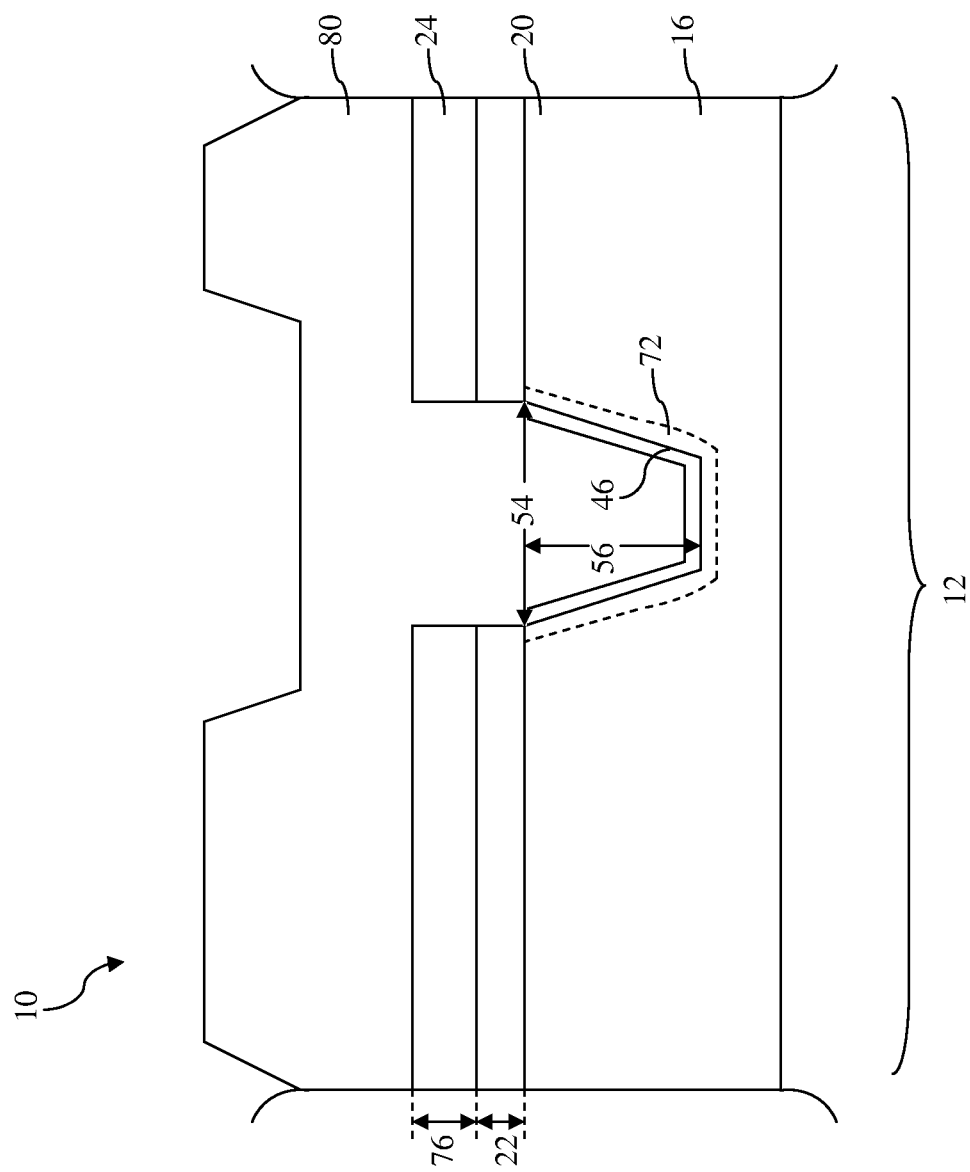

Referring now to FIG. 8, a dielectric material 80 is deposited over the protective layer 24 and fills the recess 46. The dielectric material 80 may include a silicon oxide material. Alternatively, the dielectric material 80 may include a silicon oxynitride material. Referring back to FIG. 8, the dielectric material 80 is deposited using a CVD process. Alternatively, the dielectric material 80 may be deposited using a PVD process or a plasma-enhanced chemical vapor deposition (PECVD) process known in the art. As discussed above, the recess 46 has a width 54 that is in a range from about 1500 Angstroms to about 2100 Angstroms, and the recess 46 has a depth that is in a range from about 2500 Angstroms to about 4000 Angstroms. An aspect ratio of the recess 46 may be defined as the depth 56 divided by the width 54. From the range of the values for the width 54 and the depth 56 of the recess 46, it is apparent that the aspect ratio can be as great as 2.67 (4000 Angstroms divided by 1500 Angstroms) and may be even greater in alternative embodiments. Furthermore, since the pad oxide layer 20 and the protective layer 24 effectively increase the depth 56 of the recess 46, an effective aspect ratio of the recess 46 is even higher, after taking into account the thickness 22 of the pad oxide layer 20 and the thickness 76 of the protective layer 24. A high aspect ratio in combination with relatively small dimensions of the recess 46 (especially the width 54) make it more difficult for the dielectric material 80 to fully fill the recess 46. Thus, the reduced thickness 76 of the protective layer 24 decreases the effective aspect ratio and makes it easier for the dielectric material 80 to fully fill the recess 46, in comparison to the case where the thickness of the protective layer 24 is unreduced.

Figure 9:
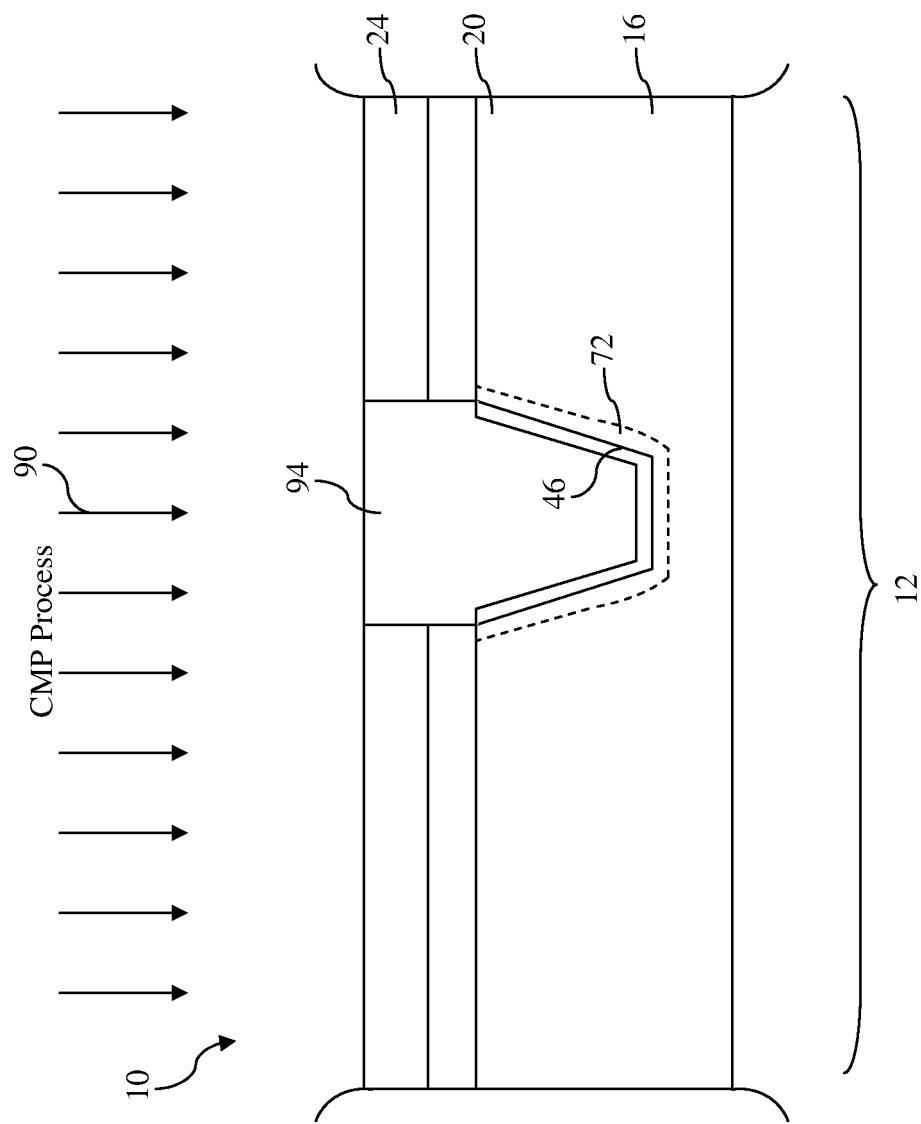

Referring now to FIG. 9, a CMP process 90 is performed on the dielectric material 80 to remove the dielectric material 80 over the protective layer 24 and form a smooth and flat surface on the dielectric material 80 filling the recess 46. The protective layer 24 serves as a CMP stop layer for the CMP process 90. The dielectric material 80 filling the recess 46 is a part of a shallow trench isolation (STI) structure 94. The STI structure 94 may be used to isolate other semiconductor transistor devices on either side of the STI structure 94, such as radiation sensing image pixels (which may not be formed yet and thus are not illustrated).

Although not illustrated, additional processing is performed to finish the fabrication of the image sensor 10. For example, the protective layer 24 is removed by an etching process or a CMP process known in the art. Thereafter, image pixels are formed in the pixel-array region 12, for example through a plurality of photolithography processes and doping processes known in the art. In addition, gate, source and drain regions are formed by various patterning and doping processes. Finally, image filters and micro-lenses are formed on the image sensor 10 for filtering and focusing radiation propagating toward the image sensor 10.

Figure 10:
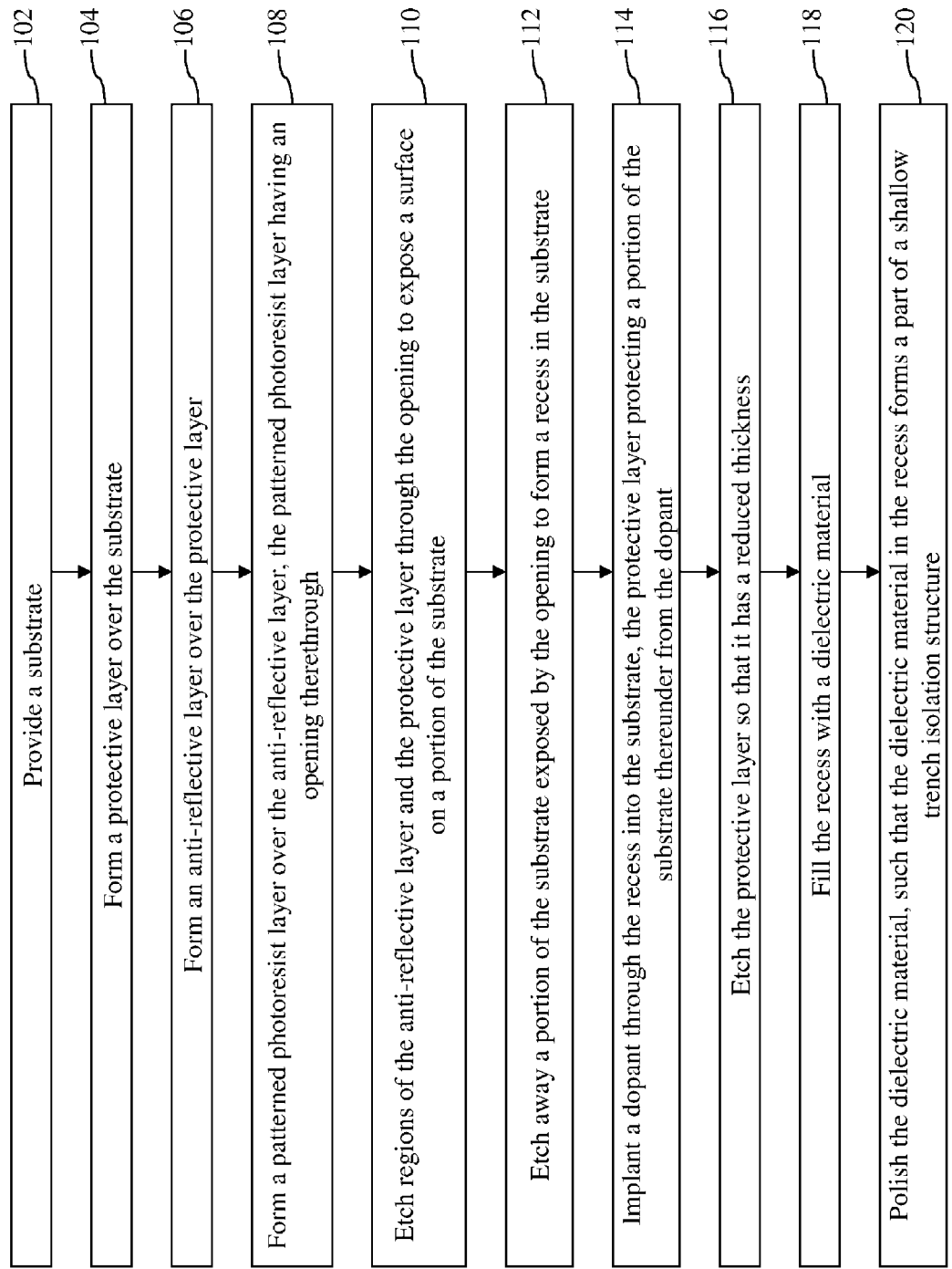
FIG. 10 is a high-level flowchart that summarizes a method of fabricating the image sensor of FIGS. 1 to 9.

FIG. 10 is a high-level flowchart that summarizes the method discussed above in association with FIGS. 1-9. In block 102, and with reference to FIG. 1, the substrate 16 is provided. The pad oxide layer 20 is formed over the substrate 16. In block 104, the protective layer 24 is formed over the substrate 16. In block 106, the anti-reflective layer 28 is formed over the protective layer 24 and reflects light in a photolithography process. In block 108, the photoresist layer 34 is formed over the anti-reflective layer 28 and is patterned by the photolithography process 36 to have the opening 38 therethrough. In block 110, and with reference to FIG. 2, regions of the anti-reflective layer 28 and the protective layer 24 are etched through the opening 38 to expose a surface of the substrate 16. In block 112, the portion of the substrate 16 exposed by the opening 38 is etched away to form the recess 46 in the substrate 16 below the opening 38. With reference to FIG. 3, the lining oxide 60 is formed over a surface of the substrate 16 in the recess 46. In block 114, and with reference to FIG. 5, a dopant is implanted through the recess 46 into the region 72 of substrate 16 below the recess 46. The protective layer 24 protects the pad oxide layer 20 and the substrate 16 thereunder from the dopant during the implantation process 70. In block 116, and with reference to FIG. 7, a portion of the protective layer 24 is etched so that the protective layer 24 has a reduced thickness 76. In block 118, and with reference to FIG. 8, the recess 46 is filled with the dielectric material 80. In block 120, and with reference to FIG. 9, the dielectric material 80 is polished and smoothed, such that the dielectric material 80 in the recess 46 forms a part of a shallow trench isolation structure 94.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a substrate;
forming a protective layer over the substrate, the protective layer having a first thickness;
forming a patterned photoresist layer over the protective layer, the patterned photoresist including first and second openings and being different than the protective layer;
forming an upwardly open first recess and an upwardly open second recess in the substrate, the first and second recesses being aligned with the first and second openings;
growing a lining oxide on a surface of the substrate within at least the first recess;
forming a mask over the second recess and the second opening;
thereafter implanting a dopant into a first region of the substrate through the first opening, the protective layer protecting a second region of the substrate from the dopant, the second region being different from the first region, and wherein the mask prevents the dopant from being implanted through the second opening;
after implanting the dopant into the first region of the substrate through the first opening, reducing the thickness of the protective layer to a second thickness less than the first thickness; and
after the reducing of the thickness of the protective layer, forming a dielectric material within at least the first recess.

2. A method according to claim 1, wherein the first recess is formed in a pixel-array region of the substrate, and wherein the second recess is formed in a periphery region of the substrate.

3. A method according to claim 1, further including:
before the implanting, forming a silicon-rich oxide layer over the protective layer, the silicon-rich oxide layer serving as an anti-reflective coating; and
wherein forming the dielectric material within at least the first recess includes:
filling at least the first recess with the dielectric material; and
performing a chemical-mechanical-polishing process on the dielectric material;

wherein the dielectric material in the first recess forms a part of an isolation structure.

4. A method according to claim 3, including utilizing the protective layer as a stop layer for the chemical-mechanical-polishing process.

5. A method according to claim 3, including carrying out the forming of the first recess so that the first recess has a depth that is in a range from about 2500 Angstroms to about 4000 Angstroms and a width that is in a range from about 1500 Angstroms to about 2100 Angstroms.

6. A method according to claim 3, including carrying out the forming of the silicon-rich oxide layer so that the silicon-rich oxide layer has a thickness that is in a range from about 100 Angstroms to about 400 Angstroms, and carrying out the forming of the protective layer so that the first thickness is in a range from about 1500 Angstroms to about 2000 Angstroms, and carrying out the reducing of the thickness of the protective layer so that the second thickness is in a range from about 500 Angstroms to about 800 Angstroms.

7. A method according to claim 1, including carrying out the forming of the protective layer so that the protective layer includes a dielectric material.

8. A method according to claim 1, including carrying out the forming of the protective layer so that the protective layer includes a silicon nitride material.

9. A method according to claim 1, wherein the reducing of the thickness of the protective layer includes etching the protective layer.

10. A method according to claim 1, wherein the reducing of the thickness of the protective layer is carried out so that the second thickness is about one half of the first thickness.

11. A method, comprising:
providing a substrate;
forming a protective layer over the substrate, the protective layer having a first thickness;
forming a patterned photoresist layer over the protective layer, the patterned photoresist being different than the protective layer;
performing an etching process using the patterned photoresist layer as a mask, wherein the etching process includes etching the substrate to form upwardly-open first recess and second recess therein;
growing a lining oxide on a surface of the substrate within at least the first recess;
forming a protective mask in the second recess;
thereafter implanting a dopant into a region of the substrate through the surface of the substrate within the first recess and through an opening in the protective layer provided over the substrate, the opening being aligned with the recess, and the protective layer having the first thickness and protecting regions of the substrate thereunder from the dopant, wherein the protective mask protects portions of the substrate below the second recess from implantation; and
after implanting the dopant into the region of the substrate through the surface of the substrate, reducing the thickness of the protective layer to a second thickness less than the first thickness;
and after the reducing of the thickness of the protective layer, forming a dielectric material within at least the first recess such that the dielectric material has a top surface substantially coplanar with a top surface of the protective layer having the second thickness.

12. A method according to claim 11, further including:
before the implanting, forming an oxynitride layer over the protective layer;

wherein forming the dielectric material within at least the first recess includes:
filling the recess with the dielectric material; and
performing a chemical-mechanical-polishing process on the dielectric material;
wherein the dielectric material in the recess forms a part of a shallow trench isolation structure.

13. A method according to claim 12, including utilizing the protective layer as a stop layer for the chemical-mechanical-polishing process.

14. A method according to claim 12, including carrying out the forming of the protective layer so that the protective layer includes a further dielectric material different from the dielectric material used to form the shallow trench isolation structure.

15. A method according to claim 12, including carrying out the forming of the recess so that the recess has a depth that is in a range from about 2500 Angstroms to about 4000 Angstroms and a width that is in a range from about 1500 Angstroms to about 2100 Angstroms.

16. A method according to claim 12, including carrying out the forming of the protective layer so that the first thickness is in a range from about 1500 Angstroms to about 2000 Angstroms, and carrying out the reducing of the thickness of the protective layer so that the second thickness is in a range from about 500 Angstroms to about 800 Angstroms.

17. A method according to claim 11, wherein the reducing of the thickness of the protective layer includes etching the protective layer.

18. A method, comprising:
providing a substrate;
forming a protective layer over the substrate, the protective layer having a first thickness;
forming an anti-reflective layer over the protective layer;
forming a patterned photoresist layer over the anti-reflective layer, the patterned photoresist layer having a first opening and a second opening therethrough;
etching regions of the anti-reflective layer and the protective layer through the first opening and the second opening to expose a surface on a first portion and a second portion of the substrate, respectively;
etching the first portion and the second portion of the substrate to form a first recess and a second recess in the substrate;
implanting a dopant into the substrate through the first recess but not through the second recess, the protective layer protecting regions of the substrate thereunder from the dopant;
after implanting the dopant into the substrate through the first recess but not through the second recess, etching the protective layer so that it has a second thickness less than the first thickness;
after etching the protective layer so that it has a second thickness less than the first thickness, filling the first recess with a dielectric material; and
polishing the dielectric material;
wherein the dielectric material in the first recess defines a shallow trench isolation structure.

19. A method according to claim 18, further including:
configuring the protective layer to include a further dielectric material different from the dielectric material used to form the shallow trench isolation; and
configuring the protective layer to protect portions of the substrate thereunder from being etched in the forming of the shallow trench isolation.

20. The method according to claim 1, wherein implanting the dopant into the first region of the substrate through the first opening occurs after growing the lining oxide on the surface of the substrate within at least the first recess.

* * * * *